(12) United States Patent
Earls et al.

(10) Patent No.: US 7,352,827 B2
(45) Date of Patent: Apr. 1, 2008

(54) MULTICHANNEL SIMULTANEOUS REAL TIME SPECTRUM ANALYSIS WITH OFFSET FREQUENCY TRIGGER

(75) Inventors: Jeffrey D. Earls, Forest Grove, OR (US); Alfred K. Hillman, Jr., Banks, OR (US)

(73) Assignee: Tektronix, Inc., Beaverton, OR (US)

( * ) Notice: Subject to any disclaimer, the term of this patent is extended or adjusted under 35 U.S.C. 154(b) by 602 days.

(21) Appl. No.: 10/804,672

(22) Filed: Mar. 18, 2004

(65) Prior Publication Data

US 2005/0207512 A1    Sep. 22, 2005

(51) Int. Cl.
*H04L 27/06* (2006.01)

(52) U.S. Cl. .................. 375/316; 375/229

(58) Field of Classification Search .......... 375/130, 375/140, 147, 229, 230, 232, 236, 316, 340, 375/344, 346, 349, 350
See application file for complete search history.

(56) References Cited

U.S. PATENT DOCUMENTS

| | | | |
|---|---|---|---|
| 4,459,698 A * | 7/1984 | Yumoto et al. | 375/236 |
| 5,103,402 A | 4/1992 | Morton et al. | |
| 6,301,312 B1 * | 10/2001 | Limberg | 375/326 |
| 6,307,896 B1 * | 10/2001 | Gumm et al. | 375/316 |
| 6,356,067 B1 * | 3/2002 | Nara | 324/76.23 |
| 6,363,126 B1 * | 3/2002 | Furukawa et al. | 375/344 |
| 6,608,523 B1 * | 8/2003 | Ly | 330/52 |
| 7,190,740 B2 * | 3/2007 | Chu et al. | 375/319 |
| 2004/0204034 A1 * | 10/2004 | Hanrahan | 455/552.1 |

* cited by examiner

*Primary Examiner*—Chieh M. Fan
*Assistant Examiner*—Naheed Ejaz

(57) ABSTRACT

An instrumentation receiver for multichannel simultaneously realtime spectrum analysis with frequency trigger offset inputs a wideband IF signal derived from a wideband RF signal by the receiver to both a wideband IF channel and a narrowband IF channel simultaneously. The wideband IF signal output from the wideband IF channel is sampled at a high sample rate with relatively low resolution to produce wideband signal data. The wideband IF signal input to the narrowband IF channel is frequency offset by a variable amount according to a region in the wideband IF signal where a frequency trigger event is expected and then narrowband filtered to produce a narrowband IF signal. The narrowband IF signal is sampled at a relatively low sample rate with high resolution to produce high dynamic range signal data for input to a frequency trigger function.

4 Claims, 2 Drawing Sheets

MULTICHANNEL SIMULTANEOUS REAL TIME SPECTRUM ANALYSIS WITH OFFSET FREQUENCY TRIGGER

BACKGROUND OF THE INVENTION

The present invention relates to spectrum analysis, and more particularly to an instrumentation receiver for multichannel simultaneous realtime spectrum analysis with an offset frequency trigger to allow new measurements and new views of signals in the frequency domain.

Realtime spectrum analyzers, such as the Tektronix WCA300 and WCA200 instruments, offer the ability to trigger a spectrum acquisition based on the occurrence of an event in the frequency domain. See U.S. Pat. No. 5,103,402 together with FIG. 1 herein. Providing this frequency triggering function for a wideband intermediate frequency (IF) channel presents problems with implementation. The IF signal is digitized, windowed and transformed into the frequency domain typically by a fast Fourier transform (FFT). The resulting frequency domain data is compared in a frequency domain comparator stage with a user defined frequency domain mask to produce a trigger for a receiver acquisition system. The usefulness of the trigger function is based on its ability to trigger in real time. With the wideband IF channel being sampled at a very high rate, only a custom application specific integrated circuit (ASIC) would be able to provide the speed needed to perform the realtime triggering function for the wideband IF channel. Also since the wideband IF channel has reduced resolution, i.e., the number of bits provided by the analog-to-digital conversion (ADC) function, the amount of dynamic range for the frequency trigger function is limited. For some users high dynamic range is an important part of the frequency triggering function.

What is desired is a realtime instrumentation receiver that performs a triggering function on a spectral event in real time while providing high dynamic range.

BRIEF SUMMARY OF THE INVENTION

Accordingly the present invention provides multichannel simultaneous realtime spectrum analysis with offset frequency trigger that inputs a wideband IF signal derived from a wideband RF signal by an instrumentation receiver to both a wideband IF channel and a narrowband IF channel simultaneously. The wideband IF signal output from the wideband IF channel is sampled at a high sample rate with relatively low resolution to produce wideband signal data. The wideband IF signal input to the narrowband IF channel is frequency offset by a variable amount according to a region in the wideband IF signal where a frequency trigger event is expected, and then narrowband filtered to produce a narrowband IF signal. The narrowband IF signal is sampled at a relatively low sample rate with high resolution to produce high dynamic range signal data for input to a frequency trigger function.

The objects, advantages and other novel features of the present invention are apparent from the following detailed description when read in conjunction with the appended claims and attached drawing.

DETAILED DESCRIPTION OF THE INVENTION

Figure 2:
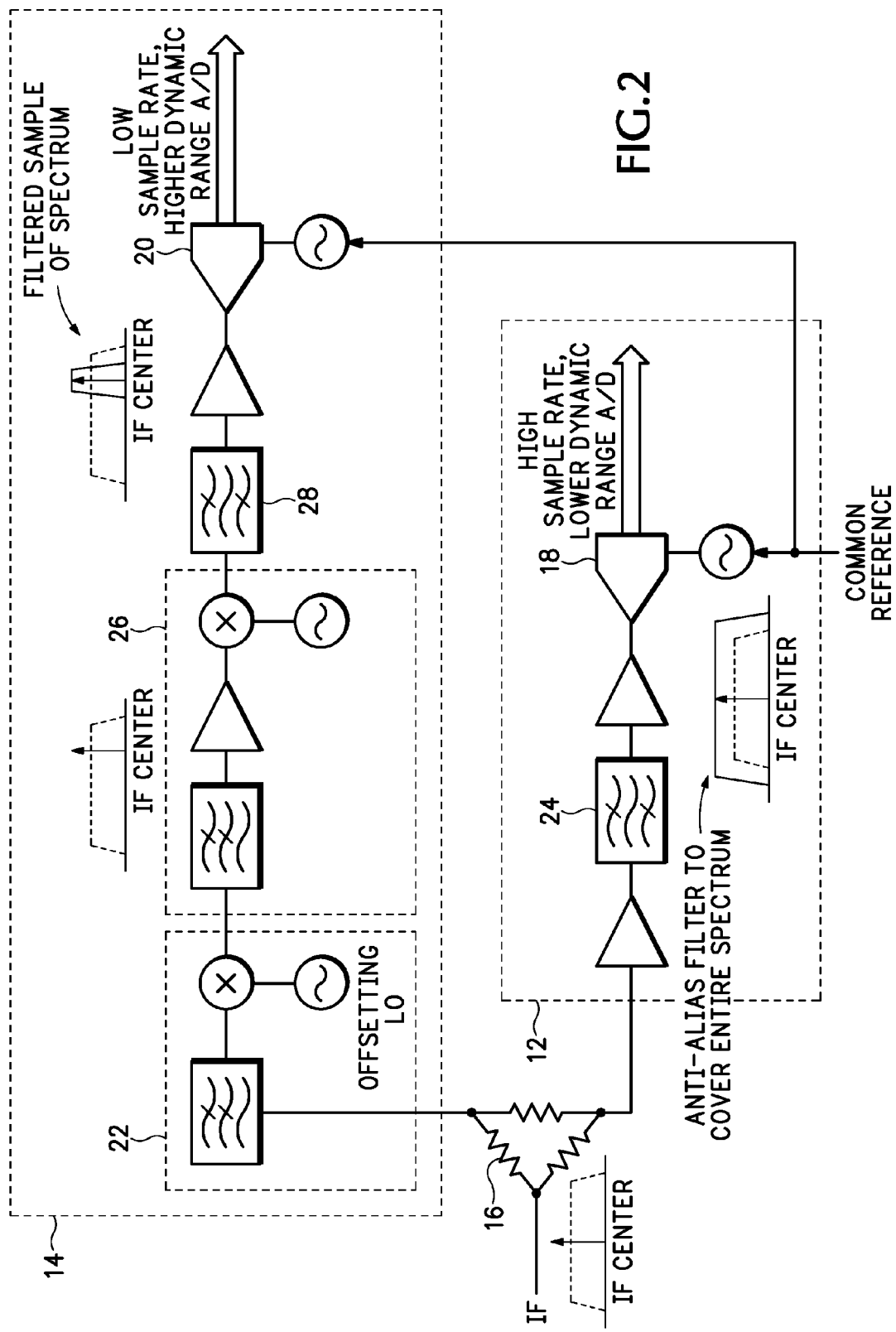
FIG. 2 is a block diagram view of an instrumentation receiver for multichannel simultaneous realtime spectrum analysis with offset frequency trigger according to the present invention.

Referring now to FIG. 2 a wideband intermediate frequency (IF) channel representing a wideband RF signal input to an instrumentation receiver is input to two IF channels 12, 14 simultaneously via a signal splitter 16, each IF channel having different properties. One channel 12 is a wideband channel with a very wide bandwidth that is sampled with a very fast analog-to-digital converter (ADC) 18. The other channel 14 is a narrowband channel with a narrower bandwidth that is sampled at a slower rate with a higher dynamic range ADC 20. The narrowband channel 14 includes a frequency offsetting conversion stage 22 in order to move the sampled acquisition anywhere within the spectrum of the wide bandwidth channel 12.

The IF signal of the wideband IF channel is derived from a common receiver (not shown) that samples a wideband input spectrum, as is common in the art. The IF signal is split by the splitter 16 into the two IF channels 12, 14. The wide bandwidth channel 12 passes the IF signal through a bandpass filter 24 that acts as an anti-aliasing filter and samples the IF signal directly with the fast ADC 18 at a relatively low resolution, the fast ADC having a typical sample rate between several hundred megahertz up to a few gigahertz. The narrowband channel 14 uses one or more conversion stages 22, 26 to accomplish the function of offsetting the IF signal by a variable amount and placing a narrow bandpass filter 28 on the offset subsection of the wideband spectrum. The narrow subsection of the wideband spectrum is then sampled at a lower rate, such as approximately 100 MHz, with the higher resolution ADC 20. Both of the ADCs 18, 20 are locked to a common reference frequency.

Figure 1:
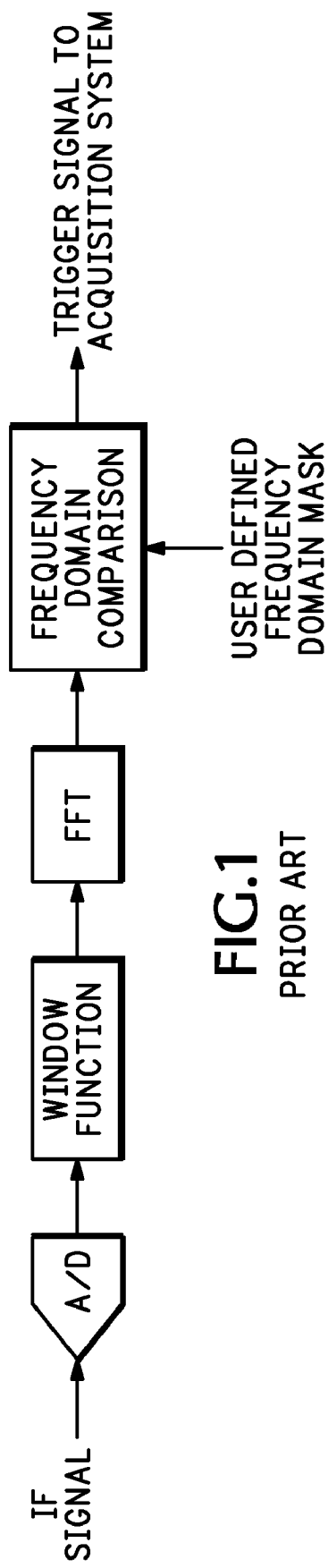
FIG. 1 is a block diagram view of a prior art frequency trigger function.

The narrowband IF channel 14 provides the frequency trigger capability, while the wideband IF channel 12 provides for wideband signal acquisition. A user places the narrowband filter 28 across the band of frequencies where a frequency domain event is expected to occur. The narrowband IF data from the high resolution ADC 20 is passed through a frequency trigger module, such as that shown in FIG. 1, which may be implemented with off-the-shelf field programmable gate arrays (FPGAs) due to the slower sampling rate. Also the higher resolution ADC 20 provides additional resolution (more bits) so the dynamic range available to the frequency trigger function is increased over that available from the wideband IF channel 12.

Thus the present invention provides an instrumentation receiver for multichannel simultaneous realtime spectrum analysis with an offset frequency trigger by routing a wideband IF signal acquired by the receiver from a wideband RF signal through two IF channels, a wideband channel and a narrow band channel, the wideband channel being sampled by a high speed, low resolution ADC, the narrowband channel being sampled by a slower, high resolution ADC and the narrowband of the narrowband channel being variable via a frequency offset to cover any desired subsection of the wideband channel, the output from the narrowband channel being input to a frequency trigger function.

What is claimed is:

1. An instrumentation receiver that converts a wideband RF signal to a wideband IF signal comprising:
   - a wideband IF channel having the wideband IF signal as an input to provide wideband signal acquisition data; and
   - a narrowband IF channel comprising a frequency offsetting conversion stage having the wideband IF signal as an input to offset the frequency of the wideband IF signal by a variable amount;
   - a narrowband filter, filtering the frequency offset wideband IF signal to produce a narrowband IF signal offset within the original wideband IF signal; and
   - an analog to digital converter sampling the narrowband IF signal at a relatively slow sample rate with a high resolution to provide the high dynamic range signal data for use in a frequency trigger function.

2. The receiver as recited in claim 1 wherein the wideband IF channel comprises means for sampling the wideband IF signal at a high sample rate with a relatively low resolution to provide the wideband signal acquisition.

3. The receiver as recited in claim 2 wherein the wideband IF channel further comprises an anti-aliasing filter having the wideband IF signal as an input and providing an anti-aliased wideband IF signal as input to the sampling means.

4. A method of processing a wideband signal to provide high dynamic range sampled data for use in a frequency trigger function comprising the steps of:
   - inputting the wideband signal to both a narrowband channel and a wideband channel simultaneously;
   - sampling the wideband signal output from the wideband channel at a high sample rate with a relatively low resolution to provide wideband signal acquisition data;
   - varying a frequency offset in the narrowband channel to cover a desired subsection of the wideband signal;
   - narrowband filtering the frequency offset wideband signal to provide a narrowband signal from the wideband signal; and
   - sampling the narrowband signal output from The narrowband channel at a relatively low sample rate with a high resolution to provide the high dynamic range sampled data.

* * * * *